United States Patent
Hou et al.

(10) Patent No.: US 7,503,771 B2
(45) Date of Patent: Mar. 17, 2009

(54) SOCKET HAVING FASTENING MECHANISM FOR RECEIVING SENSOR

(75) Inventors: Sung-Pei Hou, Tu-Cheng (TW); Li-Bang Chen, Tu-Cheng (TW); Andrew Gattuso, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/880,575

(22) Filed: Jul. 23, 2007

(65) Prior Publication Data

US 2009/0029571 A1    Jan. 29, 2009

(51) Int. Cl.
    *H01R 12/00* (2006.01)
(52) U.S. Cl. ........................................................ 439/71
(58) Field of Classification Search .................. 439/71, 439/525, 526; 361/785, 704, 776, 789, 764, 361/705; 257/719
    See application file for complete search history.

(56) References Cited

U.S. PATENT DOCUMENTS

| 5,003,293 | A  | * | 3/1991  | Wu ........................ 340/286.01 |
| 5,267,395 | A  | * | 12/1993 | Jones et al. ................... 29/829 |
| 6,196,849 | B1 | * | 3/2001  | Goodwin ...................... 439/71 |
| 6,279,225 | B1 | * | 8/2001  | Martin et al. .................. 29/740 |
| 7,038,919 | B2 |   | 5/2006  | McHugh et al. |
| 7,196,907 | B2 | * | 3/2007  | Zheng ........................ 361/760 |
| 2005/0012516 | A1 | | 1/2005 | Hou |

* cited by examiner

*Primary Examiner*—Gary F. Paumen
(74) *Attorney, Agent, or Firm*—Wei Te Chung

(57) ABSTRACT

A socket connector for settling an integrated circuit module therein and connecting a sensor therewith comprises a base, a center plate mounted on the base, a plurality of contacts retained on the center plate and a retaining member. The base defines a slot for receiving the retaining member and a fastening hole for receiving the sensor, the retaining member comprises a blocking abutting against the sensor received in the fastening hole and a spring urging the blocking toward the sensor.

14 Claims, 5 Drawing Sheets

SOCKET HAVING FASTENING MECHANISM FOR RECEIVING SENSOR

BACKGROUND OF THE INVENTION

1. Field of the Invention

The present invention relates to a socket having a fastening mechanism for reliably fastening a sensor thereon.

2. Description of the Prior Art

Electronic packages, such as integrated circuits (ICs), are miniaturized electronic devices in which a number of active and passive circuit elements are located on or within a continuous body of material to perform the function of a complete circuit. To ensure reliability of ICs, ICs require burn-in, in which ICs are operated at high temperature for an extended period of time to accelerate failure mechanisms, to eliminate early product failures before the ICs are sold and assembled into the end product. Thus, a burn-in socket is needed to receive an IC therein and electrically connect the IC with a burn-in board.

During such process, a sensors is used to provide the operator with burn-in data, such as temperature of the environment, position of the ICs. However, conventional burn-in sockets do not provide any fastening mechanism for retaining the sensors easily, the operators have no choice but to truss or plaster the sensors on the burn-in sockets, which obviously can not ensure the proper position of the sensor and can not provide credible burn-in data.

U.S. Pat. No. 7,038,919 discloses an improved burn-in socket. The burn-in socket has a substantially rectangular body with a receiving space for ICs and defines a horizontal hole inwardly recessed from an outside surface of a sidewall of the body and a vertical hole downwardly recessed from a top surface of the sidewall to communicate with the horizontal hole. A sensor inserts into the horizontal hole, then a screw inserts into the vertical hole to press the sensor and retain the sensor in the body. A metal washer with screw thread is received in the vertical hole to engage with the screw and prevent the screw destroy the sidewall of the body. However, the screw is inserted by manual work that will increase assembling steps and product cost.

Hence, a new socket which overcomes the above-described disadvantages is desired.

SUMMARY OF THE INVENTION

Accordingly, an object of the present invention is to provide a socket having fastening mechanism for easily retaining a sensor thereon.

In order to achieve the abovementioned object, a socket in accordance with a preferred embodiment of the present invention comprises a body receiving a plurality of contacts therein, the body defining a slot and a fastening hole communicating with the slot, and a retaining member received in the slot of the body, the retaining member comprising a blocking protruding into the fastening hole and a spring urging the blocking toward the fastening hole.

Other objects, advantages and novel features of the present invention will become more apparent from the following detailed description when taken in conjunction with the accompanying drawings, in which:

DESCRIPTION OF THE PREFERRED EMBODIMENTS

Figure 1:
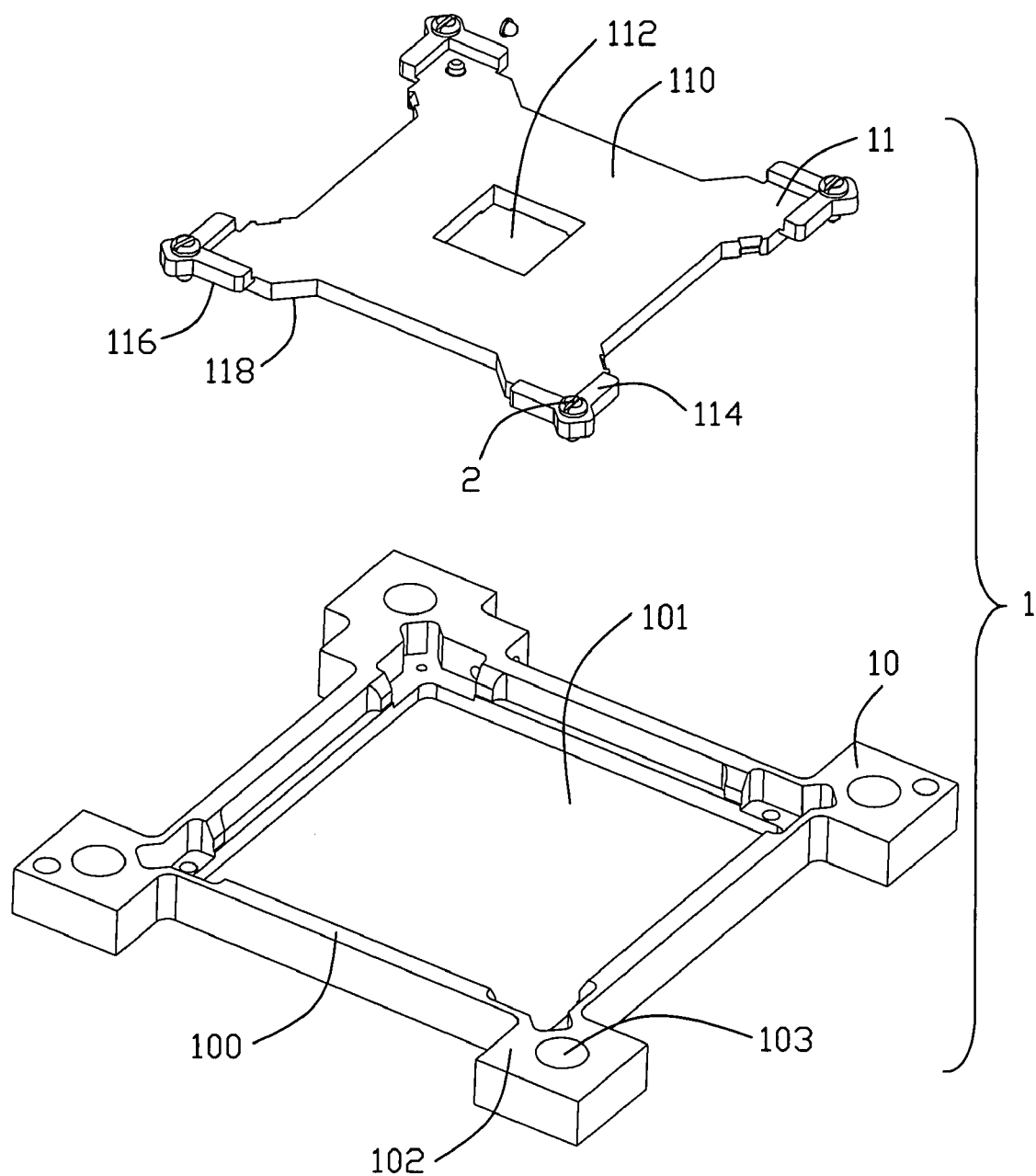
FIG. 1 is a partially exploded, perspective view of a socket in accordance with the preferred embodiment of the present invention.

Reference will now be made to the drawing figures to describe the present invention in detail.

Figure 2:
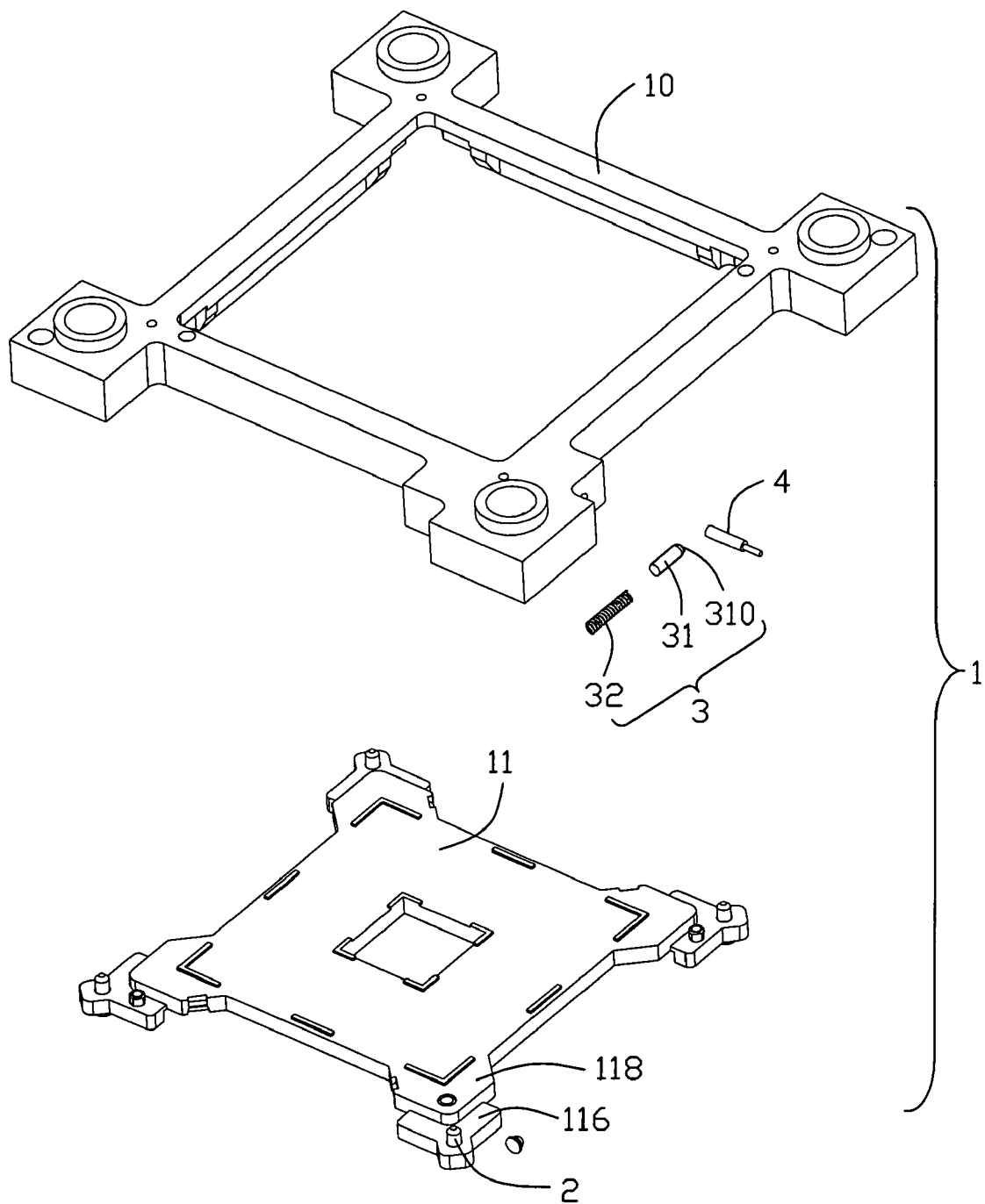
FIG. 2 is another partially exploded, perspective view of the socket in FIG. 1, taken from a bottom side, wherein a sensor is shown.

Referring to FIGS. 1-2, a socket 1 in accordance with the preferred embodiment of the present invention is adapted to electrically connect an IC (not shown) to a burn-in board (not shown).

The socket 1 has a body and a plurality of contacts (not shown) received in the body for contacting with the IC, the body comprises a base 10 and a center plate 11 mounted on the base 10. The base 10 has an approximately rectangular frame 100 with a receiving space 101 in the center and four retaining portions 102 respectively adjacent to four corners of the frame 100, each retaining portion 102 having a through hole 103. The center plate 11 has an approximately rectangular board 110 with a hole 112 in a center thereof and four mounting portions 114 adjacent to four corners of the board 110, each mounting portion 114 defining an aperture (not labeled) for a blot 2. The mounting portions 114 of the center plate 11 upwardly protrude beyond a top surface of the board 110 with a bottom surface 116 thereof higher than a bottom surface 118 of the board 110.

Figure 3:
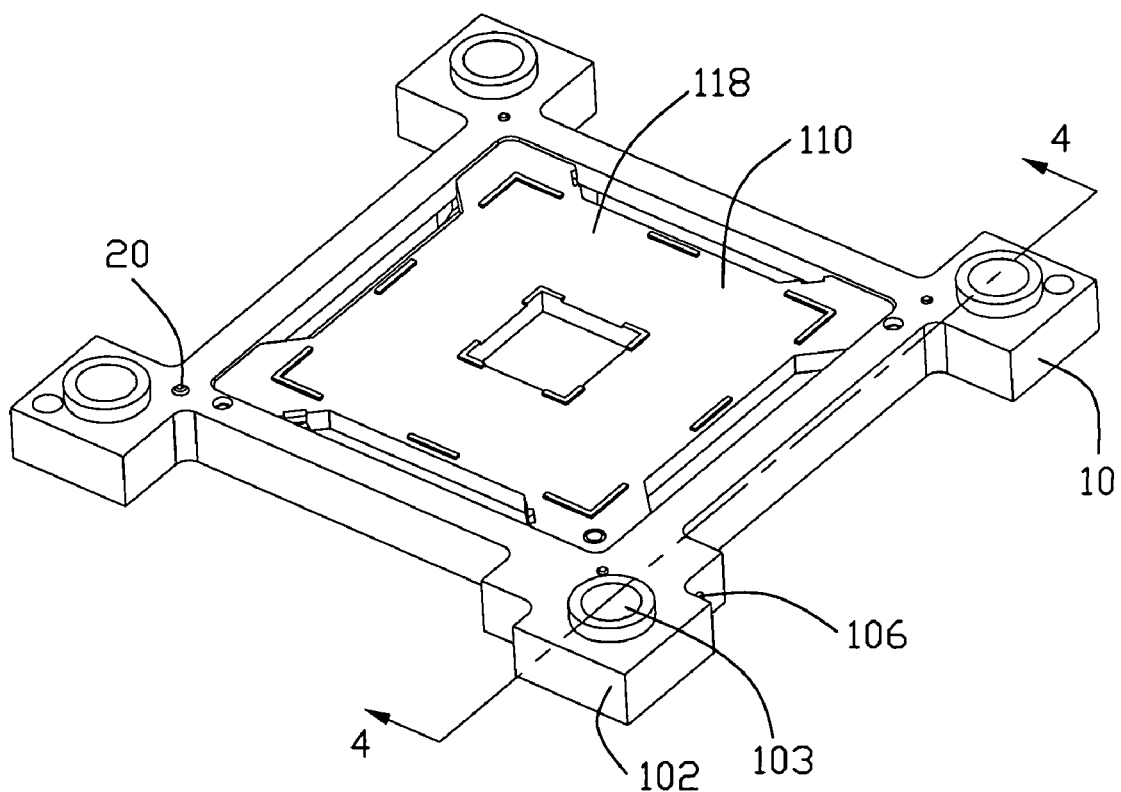
FIG. 3 is an assembled, perspective view of the socket taken from a bottom side.
Figure 4:
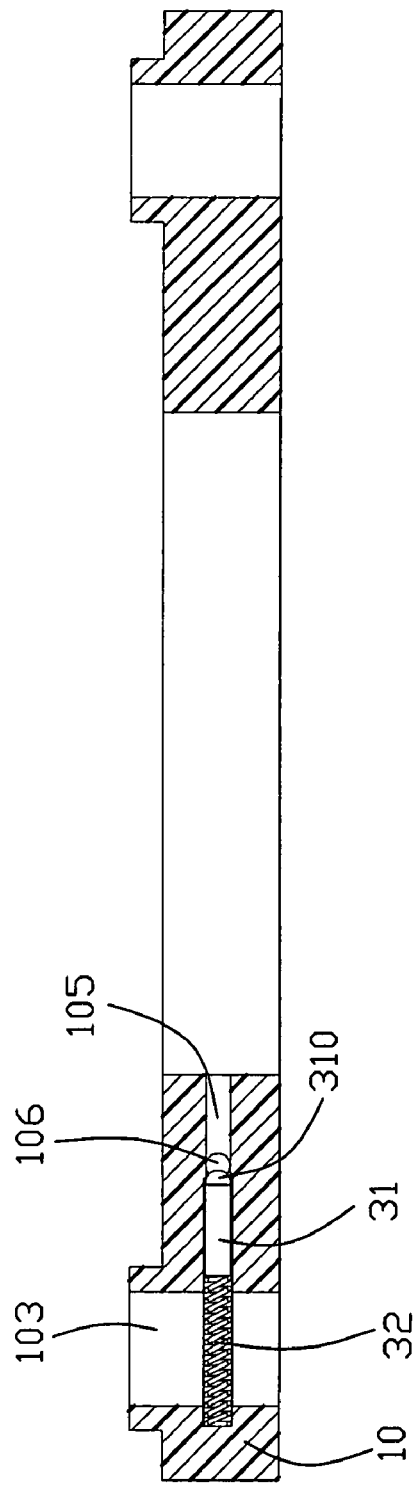
FIG. 4 is a cross sectional view of the socket, taken from line 4-4 in FIG. 3.
Figure 5:
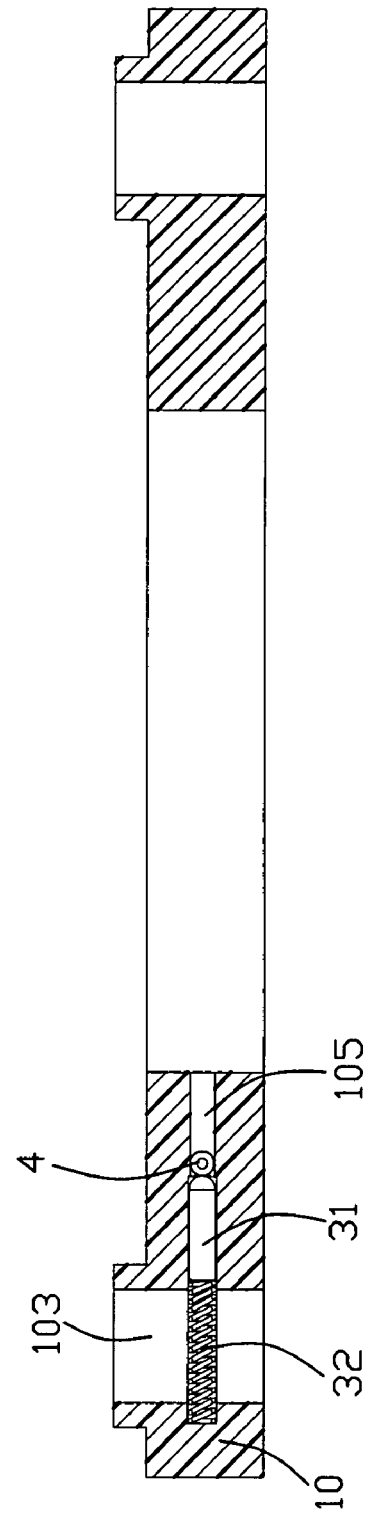
FIG. 5 is another cross sectional view similar with FIG. 4, showing the sensor inserted into the socket.
Figure 6:
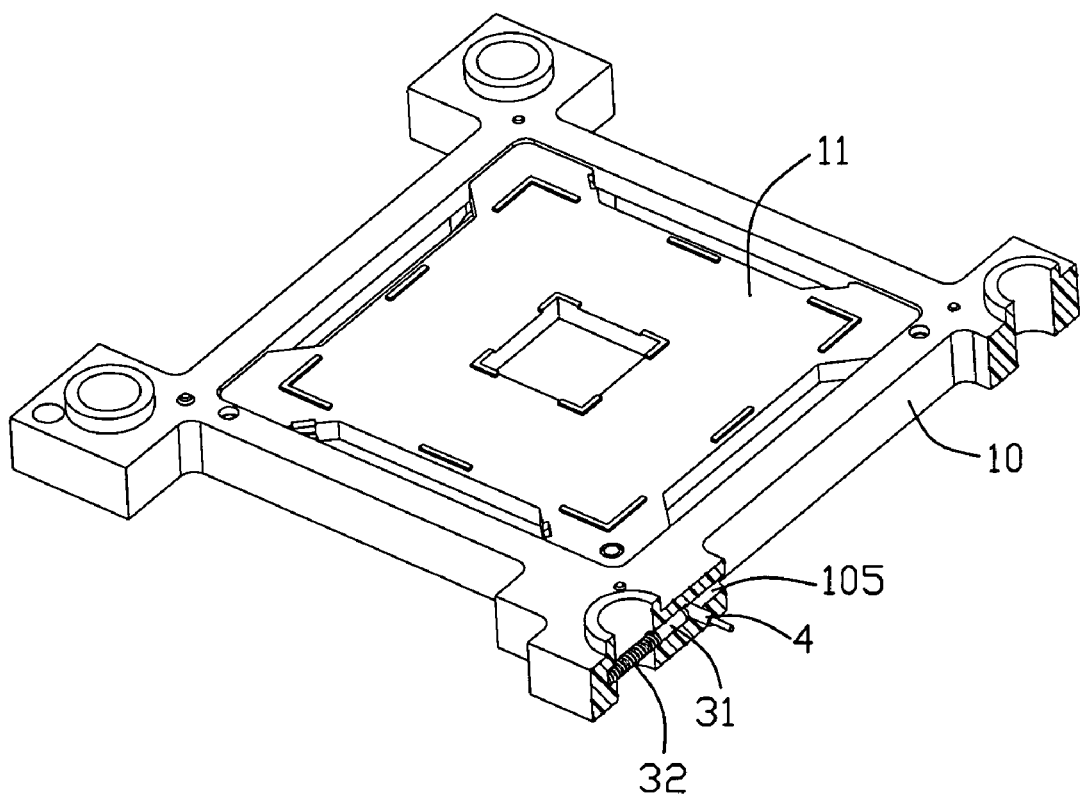
FIG. 6 is a partially cutaway perspective view of the socket, wherein the sensor is assembled to the socket.

Conjoined with FIG. 3, when assembly, the center plate 11 is mounted to the base 10 along a top-to-bottom direction, and a plurality of blots 2 fasten the center plate 11 with the base 10 together through the aperture (not labeled); The board 110 of the center plate 11 is received in the center hole 101 of the base 10 and the bottom surface 118 of the board 110 is substantially coplanar with a bottom surface of the base 10. The board 110 further defines a plurality of contact passages (not shown) arranged in matrix for receiving the contacts (not shown). The IC is downwardly set on the board 110 to electrically contact with the contacts of the socket 1.

Referring to FIGS. 2-5, a sensor 4 is required to assembled with the socket 10 to provide the operator with burn-in data, such as temperature of the environment, position of the IC, etc. The socket 1 further has a retaining member 3 mounted in the base 10 for retaining the sensor 4. The retaining member 3 comprises a blocking 31 with a half-spherical header 310 and a spring 32. One of the retaining portion 102 on the base 10 defines a horizontal slot 105 for receiving the retaining member 3 and a horizontal fastening hole 106 for receiving the sensor 4 which is perpendicular to the slot 105. The slot 105 extends across the through hole 103 and the fastening hole 106 on the retaining portion 102 to form an end being away from the fastening hole 106 but not extending though the retaining portion 102 and the other opposed end extending through the retaining portion 102. The slot 105 communicates with the through hole 103 and the fastening hole 106. The blocking 31 is inserted into the slot 105 by the through hole 103, then, the spring 32 is inserted into and received in the slot 105 by the through hole 103, two ends of the spring 32 respectively abut against the base 10 and the blocking 31 to push the header 310 into the fastening hole 106. Since a size of the slot 105 become narrow at a part thereof adjacent to the fastening hole 106 to prevent the blocking 31 further insert in, but allow the header 310 insert into the fastening hole 106.

Referring to FIGS. 3-6, in using, the sensor 4 is inserted into the fastening hole 106 and pushes the blocking 31 to move away from the fastening hole 106, simultaneously, the spring 32 is compressed, after the sensor arrive a proper position of the fastening hole 106, the blocking 31 which is urged by the spring 32 can tightly restrict the sensor 4 at the proper position, without additional force. And as a result, the sensor 4 is reliably and easily fastened in the socket 1.

Of course, we may adapt another method to receiving the retaining member 3. For example, the slot 105 may extends through the retaining portion 102 at both ends thereof, the retaining portion 102 may define another gap communicating with the slot 105 near the first end of the slot 105 away form the fastening hole 106, so the blocking 31 and the spring 32 may insert into the slot 105 from the first end of the slot 105 to the second end, after that a metal piece is used to be inserted into the gap to prevent the springs 32 from moving out.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A burn-in socket comprising:
   a body receiving a plurality of contacts therein and defining a slot and a fastening hole communicating with the slot; and
   a retaining member received in the slot, the retaining member comprising a blocking protruding into the fastening hole and a spring urging the blocking into the fastening hole.

2. The burn-in socket as described in claim 1, wherein the fastening hole is substantially perpendicular to the slot.

3. The burn-in socket as described in claim 2, wherein both the slot and the fastening hole extend in a horizontal direction.

4. The burn-in socket as described in claim 1, wherein the body comprises a base and a center plate mounted on the base and defining a plurality of contact passages for receiving the contacts.

5. The burn-in socket as described in claim 4, wherein the center plate has a board received in a center hole defined by the base and at least one retaining portion retained to the base.

6. The burn-in socket as described in claim 5, wherein the slot and the fastening hole are defined on the retaining portion of the base, the retaining portion further defines a through hole, through which the blocking and the spring insert into the slot.

7. A socket for settling an integrated circuit module therein and connecting a sensor therewith comprising:
   a body receiving a plurality of contacts therein and defining a fastening hole receiving the sensor; and
   a retaining member comprising a blocking abutting against the sensor received in the fastening hole and a spring urging the blocking toward the sensor.

8. The socket as described in claim 7, wherein the body defines a slot receiving the blocking and the spring.

9. The socket as described in claim 8, wherein both the slot and the fastening hole extend in a horizontal direction, and the slot is perpendicular to the fastening hole.

10. The socket as described in claim 9, wherein the body comprises a base and a center plate mounted on the base and having a board with a plurality of contact passages for receiving the contacts.

11. The socket as described in claim 10, wherein the center plate has a board received in a center hole defined by the base and a plurality of retaining portions retained to the base by blots.

12. A socket comprising:
   a first passageway extending in a first direction and communicating with an exterior via a first opening;
   a sensor having wire connected at an end and inserted into the first passageway from said exterior via said first opening;
   a second passageway extending in a second direction, intersecting the first passageway and communicating with the exterior via a second opening; and
   an urging device inserted into the second passageway from the exterior via the second opening; wherein
   said urging device is a tension manner to put pressure upon the sensor under a condition that the sensor is located between the urging device and the second opening.

13. The socket as claimed in claim 12, wherein said first direction is perpendicular to the second direction.

14. The socket as claimed in claim 12, further comprising a third passageway downwardly communicatively intersecting the second passageway to thereby allow external accessibility to deform said urging device for releasing the sensor.

* * * * *